(12) United States Patent
Takahashi et al.

(10) Patent No.: US 9,236,436 B2
(45) Date of Patent: Jan. 12, 2016

(54) SEMICONDUCTOR DEVICE

(75) Inventors: Tetsuo Takahashi, Chiyoda-ku (JP); Takami Otsuki, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 219 days.

(21) Appl. No.: 12/651,055

(22) Filed: Dec. 31, 2009

(65) Prior Publication Data

US 2010/0264507 A1 Oct. 21, 2010

(30) Foreign Application Priority Data

Apr. 16, 2009 (JP) ................. 2009-099997

(51) Int. Cl.
  *H01L 23/58* (2006.01)
  *H01L 29/40* (2006.01)
  *H01L 29/06* (2006.01)
  *H01L 29/739* (2006.01)

(52) U.S. Cl.
  CPC .......... *H01L 29/404* (2013.01); *H01L 29/0619* (2013.01); *H01L 29/7395* (2013.01); *H01L 29/0638* (2013.01)

(58) Field of Classification Search
  CPC ........................ H01L 29/404; H01L 29/0692
  USPC .................. 257/487–496, E29.007
  See application file for complete search history.

(56) References Cited

U.S. PATENT DOCUMENTS

| 6,667,515 | B2 * | 12/2003 | Inoue ........................... 257/341 |
| 6,989,566 | B2 * | 1/2006 | Noda et al. .................... 257/339 |
| 2008/0179671 | A1 | 7/2008 | Saito et al. | |

FOREIGN PATENT DOCUMENTS

| DE | 103 02 628 A1 | 12/2003 |
| DE | 10 2004 059 620 A1 | 8/2005 |
| JP | 4-48652 | 2/1992 |
| JP | 5-190693 | 7/1993 |
| JP | 6-85270 | 3/1994 |
| JP | 6-232426 A | 8/1994 |
| JP | 11-330456 | 11/1999 |
| JP | 2000-269520 | 9/2000 |
| JP | 2005-5443 A | 1/2005 |

(Continued)

OTHER PUBLICATIONS

B. Jayant Baliga, "Power Semiconductor Devices", United States, PWS Publishing Company, 1995, 9 pages.
Office Action issued Nov. 30, 2011, in Korean Patent Application No. 10-2010-0021139 (with English-language translation).

(Continued)

*Primary Examiner* — Samuel Gebremariam
(74) *Attorney, Agent, or Firm* — Oblon, McClelland, Maier & Neustadt, L.L.P.

(57) ABSTRACT

A semiconductor device includes: a semiconductor substrate having a main surface having an element formation region, a guard ring, a guard ring electrode, a channel stopper region, a channel stopper electrode, and a field plate disposed over and insulated from the semiconductor substrate. The field plate includes a first portion located between the main surface of the semiconductor substrate and the guard ring electrode, and a second portion located between the main surface of the semiconductor substrate and the channel stopper electrode. The first portion has a portion overlapping with the guard ring electrode when viewed in a plan view. The second portion has a portion overlapping with the channel stopper electrode when viewed in the plan view. In this way, a semiconductor device allowing for stabilized breakdown voltage can be obtained.

7 Claims, 8 Drawing Sheets

(56) References Cited

FOREIGN PATENT DOCUMENTS

| | | |
|---|---|---|
| JP | 2005-101254 | 4/2005 |
| JP | 2005-209983 A | 8/2005 |
| JP | 2006-173437 | 6/2006 |
| JP | 2007-324261 A | 12/2007 |
| JP | 2009-4681 | 1/2009 |
| JP | 2009-505394 | 2/2009 |

OTHER PUBLICATIONS

Office Action issued Feb. 26, 2013 in Japanese Patent Application No. 2009-099997 (with English-language translation).

German Office Action issued Sep. 27, 2013, in German Patent Application No. 10 2010 011 259.3 (with English translation).

Office Action issued Oct. 26, 2011, in Chinese Patent Application No. 201010150094.2 with English translation.

* cited by examiner

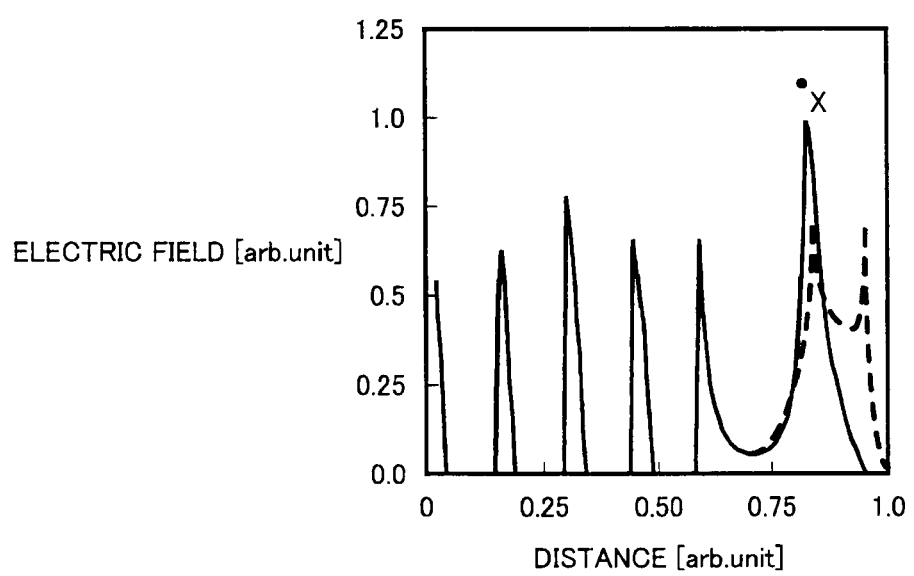

SEMICONDUCTOR DEVICE

BACKGROUND OF THE INVENTION

1. Field of the Invention

The present invention relates to a semiconductor device, in particular, to a semiconductor device having a guard ring.

2. Description of the Background Art

Generally, a power semiconductor requires a high main breakdown voltage retaining capability. For such retention of breakdown voltage, guard ring structures are generally utilized. Basic structures and applied structures thereof are disclosed in, for example, the following document or the like:

B. Jayant Baliga, "Power Semiconductor Devices", the United States, PWS PUBLISHING COMPANY, pp. 98-103

A guard ring structure is provided with an impurity region having a floating potential and surrounding an emitter to alleviate surface electric field and retain breakdown voltage.

If guard rings are provided up to the end of a semiconductor substrate, an electric field peak comes in the semiconductor substrate in the vicinity of its central portion in which an element formation region is provided. Hence, the guard rings are not formed up to the end of the semiconductor substrate.

Intervals between the guard rings are adjusted so that an electric field peak is maximal just below a guard ring electrode attached to an outermost guard ring. Unfortunately, this limits improvement of breakdown voltage just below the guard ring electrode attached to the outermost guard ring.

Also, the guard ring structure unfortunately requires a large area to retain breakdown voltage.

SUMMARY OF THE INVENTION

The present invention is made in light of the foregoing problem, and its object is to provide a semiconductor device allowing for stabilization of breakdown voltage.

A semiconductor device of the present invention includes: a semiconductor substrate having a main surface having an element formation region; a guard ring formed in the main surface of the semiconductor substrate to surround a circumference of the element formation region when viewed in a plan view; a guard ring electrode formed on the main surface of the semiconductor substrate and electrically connected to the guard ring; a channel stopper region formed in the main surface of the semiconductor substrate to be located external to the guard ring when viewed in the plan view; a channel stopper electrode formed on the main surface of the semiconductor substrate and electrically connected to the channel stopper region; and a field plate disposed over and insulated from the semiconductor substrate, the field plate including a first portion located between the main surface of the semiconductor substrate and the guard ring electrode, and a second portion located between the main surface of the semiconductor substrate and the channel stopper electrode, the first portion having a portion overlapping with the guard ring electrode when viewed in the plan view, the second portion having a portion overlapping with the channel stopper electrode when viewed in the plan view.

According to the present invention, the field plate includes the first portion located between the main surface of the semiconductor substrate and the guard ring electrode, and the second portion located between the main surface of the semiconductor substrate and the channel stopper electrode. When viewed in the plan view, the first portion has the portion overlapping with the guard ring electrode. When viewed in the plan view, the second portion has the portion overlapping with the channel stopper electrode. Accordingly, the field plate can be capacitively coupled to the guard ring electrode and the channel stopper electrode to prevent concentration of electric field just below the guard ring electrode attached to the outermost guard ring. As such, stabilized breakdown voltage can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows surface electric field distribution (electric field and distance) in the first embodiment of the present invention and that in the comparative example.

DESCRIPTION OF THE PREFERRED EMBODIMENTS

Embodiments of the present invention will be described below with reference to figures.

First Embodiment

First, a configuration of a semiconductor device of a first embodiment of the present invention will be described.

Figure 1:
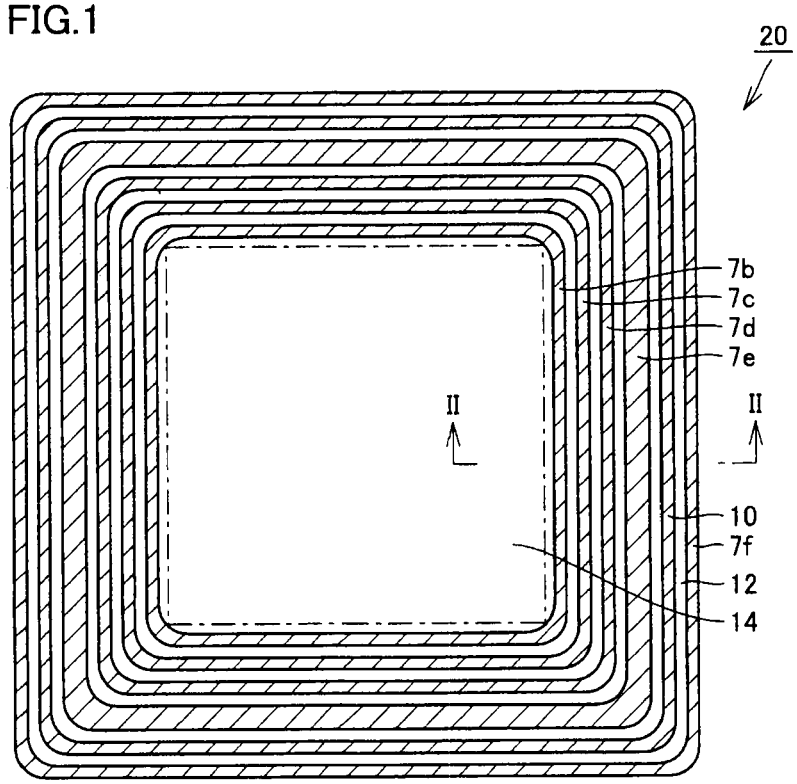
FIG. 1 is a plan view schematically showing a semiconductor device in a first embodiment of the present invention.
Figure 2:
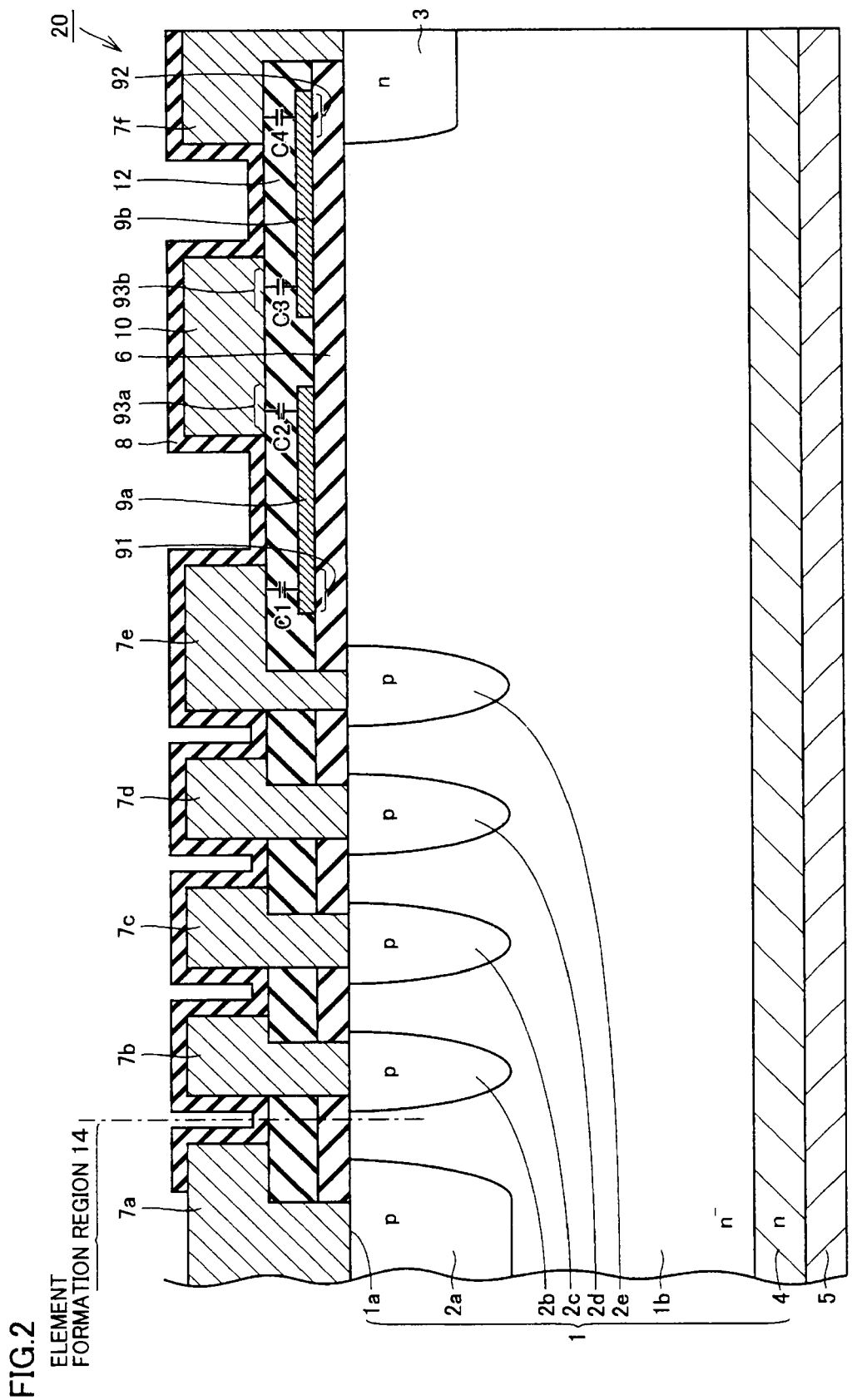
FIG. 2 is a schematic cross sectional view taken along a line II-II of FIG. 1.

Referring to FIG. 1 and FIG. 2, semiconductor device 20 of the present embodiment mainly has a semiconductor substrate 1, a collector electrode 5, a field oxide film 6, an emitter electrode 7a, guard ring electrodes 7b, 7c, 7d, 7e, a channel stopper electrode 7f, and field plates 9a, 9b, 10. For visibility, a passivation film 8 is not drawn in FIG. 1.

Referring to mainly FIG. 1, when viewed in a plan view, semiconductor device 20 has a central portion provided with a formation region 14 for a power semiconductor element such as an IGBT (Insulated Gate Bipolar Transistor). When viewed in the plan view, guard ring electrodes 7b, 7c, 7d, 7e are formed to surround a circumference of element formation region 14. When viewed in the plan view, field plate 10 and channel stopper electrode 7f are formed to surround the circumference of guard ring electrode 7e.

Referring to mainly FIG. 2, semiconductor substrate 1 has an n⁻ substrate 1b, a p-type embedded layer 2a, guard rings 2b, 2c, 2d, 2e, a channel stopper region 3, and an n-type buffer layer 4. Semiconductor substrate 1 has a main surface 1a. In main surface 1a of semiconductor substrate 1, p-type embedded layer 2a, guard rings 2b, 2c, 2d, 2e, and channel stopper region 3 are formed.

P-type embedded layer 2a is formed in element formation region 14, and constitutes, for example, a base region of the IGBT. A boundary between p-type embedded layer 2a and $n^-$ substrate 1b forms a main junction.

Guard rings 2b, 2c, 2d, 2e are provided to retain breakdown voltage. Channel stopper region 3 is formed external to outermost guard ring 2e. Channel stopper region 3 is provided to prevent a depletion layer from extending to the end of main surface 1a.

On and over semiconductor substrate 1, field oxide film 6 and interlayer insulation film 12 are formed. Emitter electrode 7a, guard ring electrodes 7b, 7c, 7d, 7e, and channel stopper electrode 7f are formed on interlayer insulation film 12. Emitter electrode 7a is electrically connected to p-type embedded layer 2a via a contact hole provided in field oxide film 6 and interlayer insulation film 12.

Guard ring electrodes 7b, 7c, 7d, 7e are respectively electrically connected to guard rings 2b, 2c, 2d, 2e via contact holes formed in field oxide film 6 and interlayer insulation film 12. Channel stopper electrode 7f is electrically connected to channel stopper region 3 via a contact hole provided in field oxide film 6 and interlayer insulation film 12.

Between field oxide film 6 and interlayer insulation film 12, field plates 9a, 9b are formed. Field plate 9a (first portion) is located between main surface 1a of semiconductor substrate 1 and guard ring electrode 7e. When viewed in the plan view, field plate 9a (first portion) has a portion 91 overlapping with guard ring electrode 7e. Overlapping portion 91 and guard ring electrode 7e constitute a capacitor C1.

Field plate 9b (second portion) is located between main surface 1a of semiconductor substrate 1 and channel stopper electrode 7f. When viewed in the plan view, field plate 9b (second portion) has a portion 92 overlapping with channel stopper electrode 7f. Overlapping portion 92 and channel stopper electrode 7f constitute a capacitor C4.

On interlayer insulation film 12, field plate 10 (third portion) is formed. Field plate 10 (third portion) belongs to the same layer as guard ring electrode 7e and channel stopper electrode 7f. In other words, field plate 10 (third portion), guard ring electrode 7e, and channel stopper electrode 7f are formed by the same layer made of, for example, aluminum.

Further, when viewed in the plan view, field plate 10 (third portion) has a portion 93a overlapping with field plate 9a (first portion). Overlapping portion 93a and field plate 9a constitute a capacitor C2. When viewed in the plan view, field plate 10 (third portion) has a portion 93b overlapping with field plate 9b (second portion). Overlapping portion 93b and field plate 9b constitute a capacitor C3.

Field plates 9a, 9b, 10 are electrically insulated from semiconductor substrate 1, guard ring electrode 7e, and channel stopper electrode 7f.

Guard rings 2b, 2c, 2d, 2e and guard ring electrodes 7b, 7c, 7d, 7e have floating potentials. Guard ring electrode 7e and field plate 9a, field plate 9a and field plate 10, field plate 10 and field plate 9b, and field plate 9b and channel stopper electrode 7f have floating potentials.

Capacitor C1 provides capacitance coupling of guard ring electrode 7e and field plate 9a. Capacitor C4 provides capacitance coupling of field plate 9b and channel stopper electrode 7f. Capacitor C2 provides capacitance coupling of field plate 9a and field plate 10. Capacitor C3 provides capacitance coupling of field plate 9b and field plate 10.

It should be noted that a distance between semiconductor substrate 1 and field plates 9a, 9b is preferably longer than a distance between field plates 9a, 9b and field plate 10. With this, the capacitance coupled between semiconductor substrate 1 and field plates 9a, 9b is smaller than the capacitance coupled between field plates 9a, 9b and field plate 10. This restrains the potentials of field plates 9a, 9b, 10 from fluctuating under an influence of the potential of main surface 1a of semiconductor substrate 1.

Passivation film 8 is formed on emitter electrode 7a, guard ring electrodes 7b, 7c, 7d, 7e, channel stopper electrode 7f, field plate 10, and interlayer insulation film 12.

Semiconductor substrate 1 has a surface opposite to main surface 1a. On this surface, n-type buffer layer 4 is formed. On n-type buffer layer 4, collector electrode 5 is formed.

Emitter electrode 7a, guard ring electrodes 7b, 7c, 7d, 7e, channel stopper electrode 7f, and field plate 10 are formed of, for example, aluminum. Field plates 9a, 9b are formed of, for example, polycrystalline silicon. Materials therefor are not limited to the materials exemplified above. They may be formed of different materials.

The configuration of semiconductor device 20 can be formed using a process flow for a general semiconductor such as an IGBT. For example, a step of embedding a gate electrode and a step of forming an emitter electrode in the process flow can be applied.

Next, an operation of a semiconductor device of the present embodiment will be described.

In semiconductor device 20 of the present embodiment, capacitor C1 provides capacitance coupling between guard ring electrode 7e and field plate 9a. Capacitor C4 provides capacitance coupling between field plate 9b and channel stopper electrode 7f. Capacitor C2 provides capacitance coupling between field plate 9a and field plate 10. Capacitor C3 provides capacitance coupling between field plate 9b and field plate 10.

In this way, capacitors C1-C4 provide capacitance coupling of guard ring electrode 7e, field plates 9a, 9b, 10, and channel stopper electrode 7f. Guard ring electrode 7e, field plate 9a, 9b, 10, and channel stopper electrode 7f have higher potentials as they are located more outwardly.

Since semiconductor device 20 of the present embodiment is provided with the plurality of guard rings 2b, 2c, 2d, 2e, the depletion layer first extends toward guard ring 2b. This alleviates electric field at a corner portion of the main junction located at the boundary between p-type embedded layer 2a and $n^-$ substrate 1b. Then, the depletion layer extends toward guard ring 2c, thereby alleviating electric field just below guard ring electrode 7b attached to guard ring 2b. In this way, the plurality of guard rings 2b, 2c, 2d, 2e allow the depletion layer to extend toward outermost guard ring 2e, thus alleviating electric field.

In this case, an electric field peak is supposed to come just below guard ring electrode 7e attached to outermost guard ring 2e. However, field plates 9a, 9b, 10 alleviate concentration of electric field just below guard ring electrode 7e attached to outermost guard ring 2e, thus stabilizing the surface potential of semiconductor substrate 1.

The following explains functions and effects of the semiconductor device of the present embodiment in comparison to a comparative example.

Figure 7:
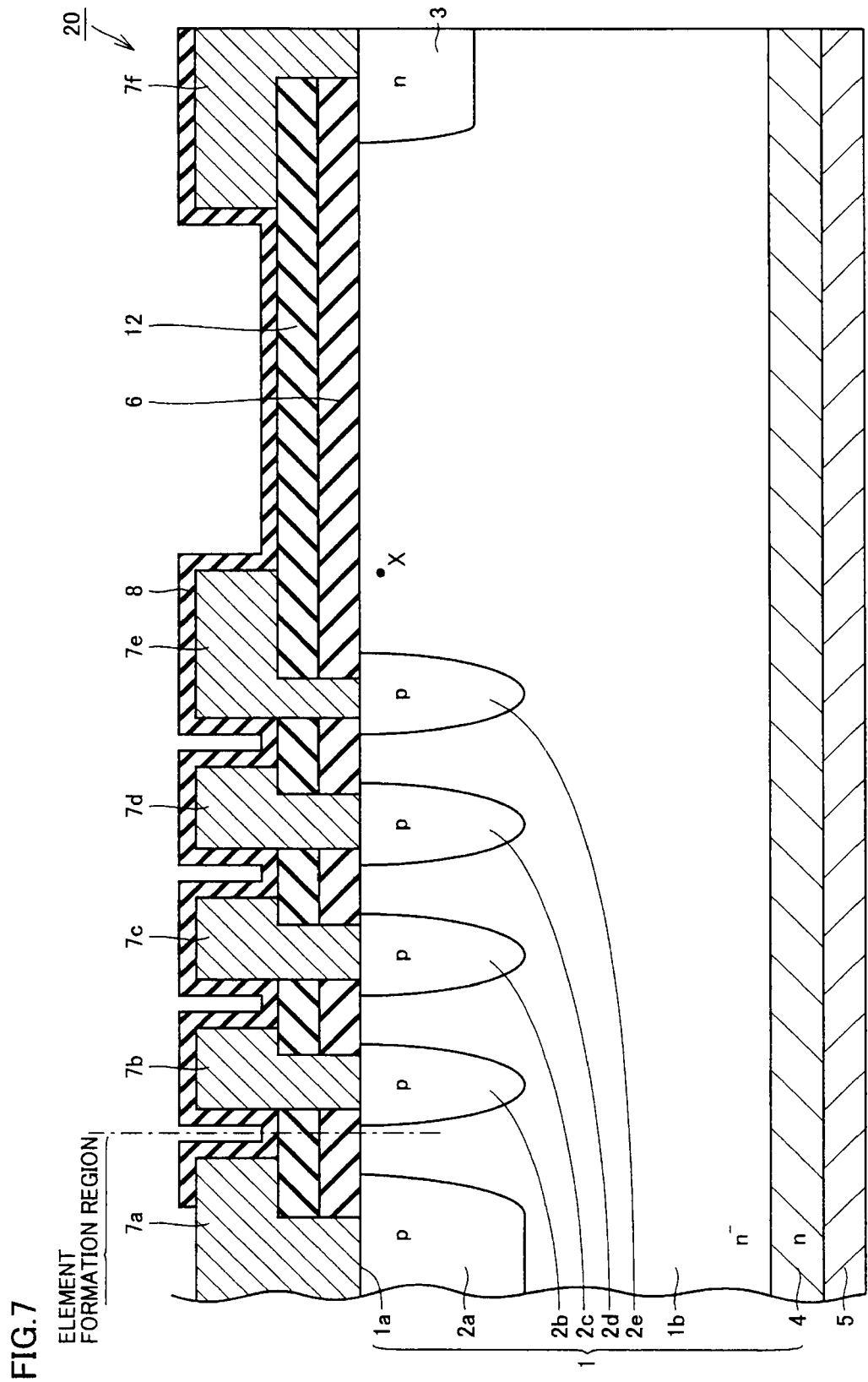
FIG. 7 is a schematic cross sectional view of a semiconductor device of a comparative example, showing a cross section corresponding to line IV-IV of FIG. 3.

Referring to FIG. 7, a semiconductor device of the comparative example is different from that of the present embodiment mainly in that no field plates 9a, 9b, 10 are formed. In semiconductor device 20 of the comparative example, a maximal electric field peak comes at a point X just below guard ring electrode 7e attached to outermost guard ring 2e.

Referring to FIG. 8, a solid line therein represents distribution of surface electric field of the semiconductor device of the comparative example. A broken line in FIG. 8 represents distribution of surface electric field of the semiconductor device of the present embodiment. The indication of point X therein represents electric field and a distance of point X located just below guard ring electrode 7e attached to outermost guard ring 2e of FIG. 7. As shown in FIG. 8, in the comparative example, an electric field peak is maximal at point X.

In contrast, semiconductor device 20 of the present embodiment is provided with field plates 9a, 9b, 10 formed external to guard ring electrode 7e attached to outermost guard ring 2e. In addition, capacitors C1-C4 provide capacitance coupling of guard ring electrode 7e, field plates 9a, 9b, 10, and channel stopper electrode 7f. This alleviates electric field exerted just below guard ring electrode 7e attached to outermost guard ring 2e, thereby preventing concentration of electric field. Thus, breakdown voltage can be increased. In this way, stabilized breakdown voltage is achieved. As shown in FIG. 8, an electric field peak is not maximal just below guard ring electrode 7e attached to outermost guard ring 2e.

In addition, semiconductor device 20 of the present embodiment achieves stabilized electric field between outermost guard ring 2e and channel stopper region 3. Accordingly, the width between outermost guard ring 2e and channel stopper region 3 can be narrowed to achieve reduction of the area of semiconductor substrate 1.

Second Embodiment

A semiconductor device of a second embodiment of the present invention is different from the semiconductor device of the first embodiment mainly in configurations of field plates.

Figure 3:
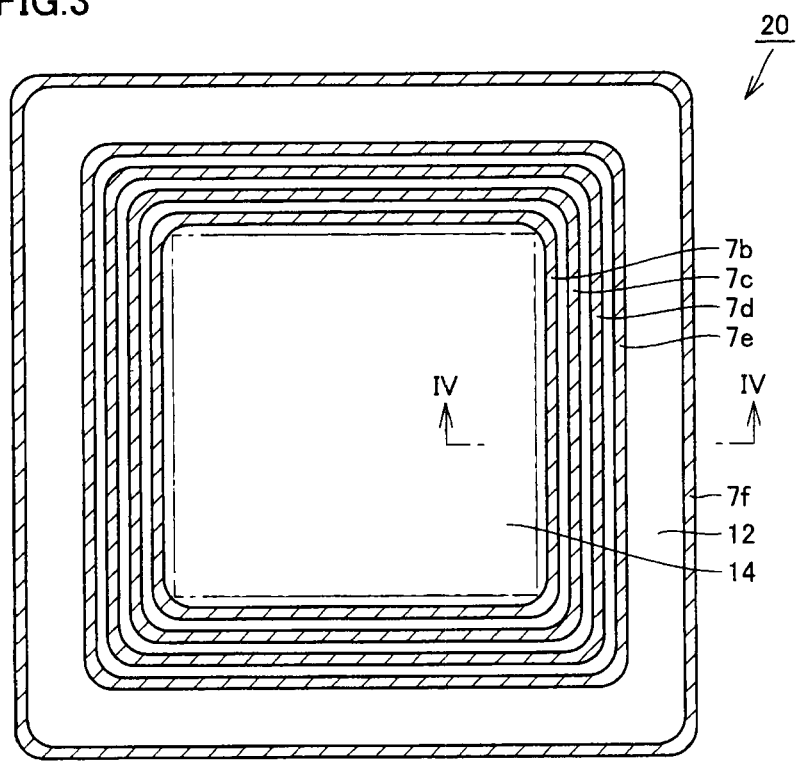
FIG. 3 is a plan view schematically showing a semiconductor device in a second embodiment of the present invention.
Figure 4:
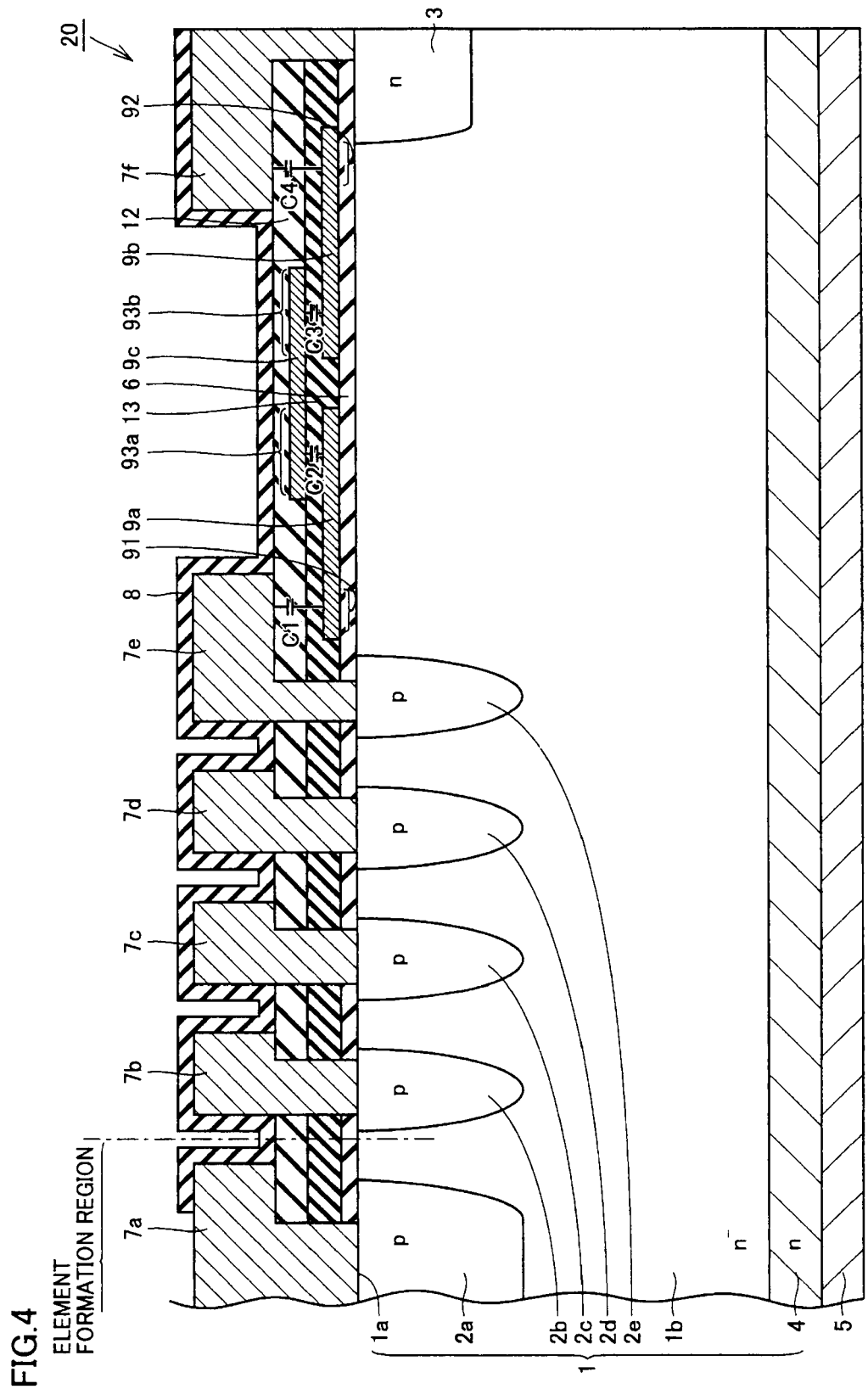
FIG. 4 is a schematic cross sectional view taken along a line IV-IV of FIG. 3.

Referring to FIG. 3 and FIG. 4, semiconductor substrate 1 has a main surface 1a over which field plates 9a, 9b are formed with a field oxide film 6 interposed between main surface 1a and field plates 9a, 9b. For visibility, in FIG. 3, a passivation film 8 is not drawn.

Formed on field plates 9a, 9b is an insulation film 13 on which a field plate 9c (third portion) is formed. On field plate 9c, an interlayer insulation film 12 is formed. On interlayer insulation film 12, a guard ring electrode 7e and a channel stopper electrode 7f are formed. In other words, field plate 9c (third portion) is formed as a layer below guard ring electrode 7e and channel stopper electrode 7f.

When viewed in a plan view, field plate 9c (third portion) has a portion 93a overlapping with field plate 9a (first portion). Overlapping portion 93a and field plate 9a constitute a capacitor C2. When viewed in the plan view, field plate 9c (third portion) has a portion 93b overlapping with field plate 9b (second portion). Overlapping portion 93b and field plate 9b constitute a capacitor C3.

Field plate 9c is formed of, for example, polycrystalline silicon doped with an impurity in high concentration.

Other configurations of the present embodiment are similar to those of the foregoing first embodiment. Hence, the same elements are given the same reference characters and will not be described repeatedly.

The configuration of semiconductor device 20 can be formed using a process flow for a general semiconductor. Semiconductor device 20 can be formed to have a desired structure, by forming field plates 9a, 9b and field plate 9c as two layers with insulation film 13 interposed therebetween.

With this, the semiconductor device of the present embodiment provides functions and effects similar to those of the first embodiment.

Since field plates 9a, 9b, 9c are formed to be contained by field oxide film 6, interlayer insulation film 12, and insulation film 13, voltage fluctuations resulting from aluminum slide, which causes a problem in a resin-molded chip, can be prevented. The term "aluminum slide" herein refers to peel-off or displacement of an aluminum wire caused by a force exerted thereon and resulting from a thermal stress arising from a difference in thermal expansion coefficient from the resin.

Third Embodiment

A semiconductor device of a third embodiment of the present invention is different from the semiconductor device of the first embodiment in configurations of field plates.

Figure 5:
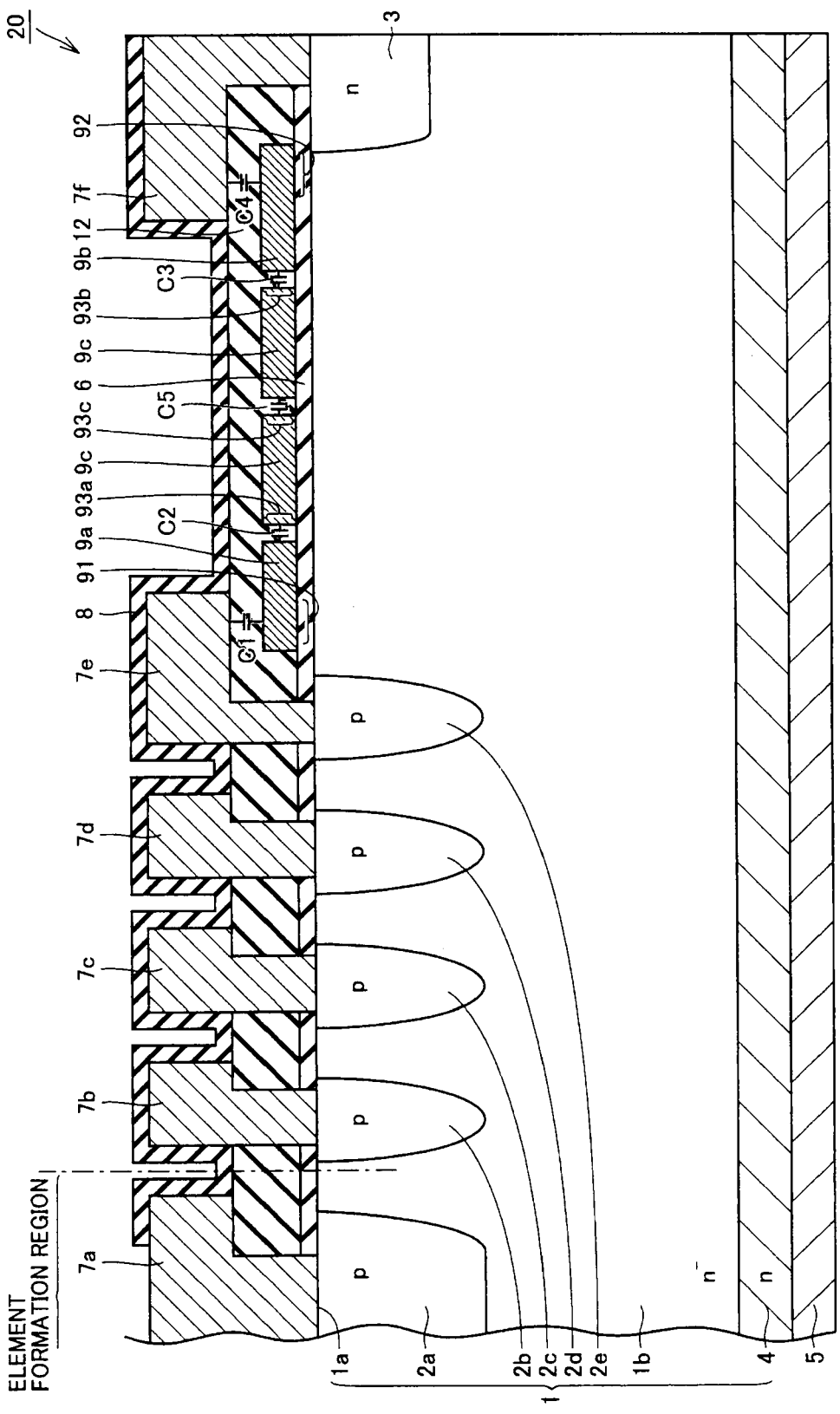
FIG. 5 is a schematic cross sectional view of a semiconductor device in a third embodiment of the present invention, showing a cross section corresponding to line IV-IV of FIG. 3.

Referring to FIG. 5, semiconductor substrate 1 has a main surface 1a over which field plates 9a, 9b are formed with a field oxide film 6 interposed between main surface 1a and field plates 9a, 9b. Field plates 9c (third portion) are formed between field plates 9a, 9b and an interlayer insulation film 12 is provided among them. In the present embodiment, two field plates 9c (third portion) are described but the present invention is not limited to this. A single or a plurality of field plates 9c may be provided. Field plates 9a, 9b, 9c are arranged along a direction in which main surface 1a of semiconductor substrate 1 extends. Field plates 9a, 9b, 9c overlap with their adjacent field plates 9a, 9b, 9c in the direction in which main surface 1a extends.

In the direction in which main surface 1a extends, field plates 9c (third portion) have a portion 93a overlapping with field plate 9a (first portion). Overlapping portion 93a and field plate 9a constitute a capacitor C2. In the direction in which main surface 1a extends, field plates 9c (third portion) have a portion 93b overlapping with field plate 9b (second portion). Overlapping portion 93b and field plate 9b constitute a capacitor C3. In the direction in which main surface 1a extends, field plates 9c (third portion) have portions 93c overlapping with each other. Overlapping portions 93c thereof constitute a capacitor C5.

Field plates 9c are formed of, for example, polycrystalline silicon doped with an impurity in high concentration.

The other configurations of the present embodiment are similar to those of the foregoing first embodiment. Hence, the same elements are given the same reference characters and will not be described repeatedly.

The configuration of semiconductor device 20 can be formed using a process flow for a general semiconductor and field plates 9a, 9b and field plate 9c can be formed as one layer.

As such, the semiconductor device of the present embodiment provides functions and effects similar to those of the first embodiment.

Field plates 9a, 9b, 9c are formed to be contained by field oxide film 6 and interlayer insulation film 12, and voltage fluctuations resulting from aluminum slide can be prevented.

In addition, since field plates 9a, 9b and field plate 9c can be formed as one layer, the number of steps in the process can be reduced to achieve simplified process steps.

Fourth Embodiment

A semiconductor device of a fourth embodiment of the present invention is different from the semiconductor device of the first embodiment in configurations of field plates.

Figure 6:
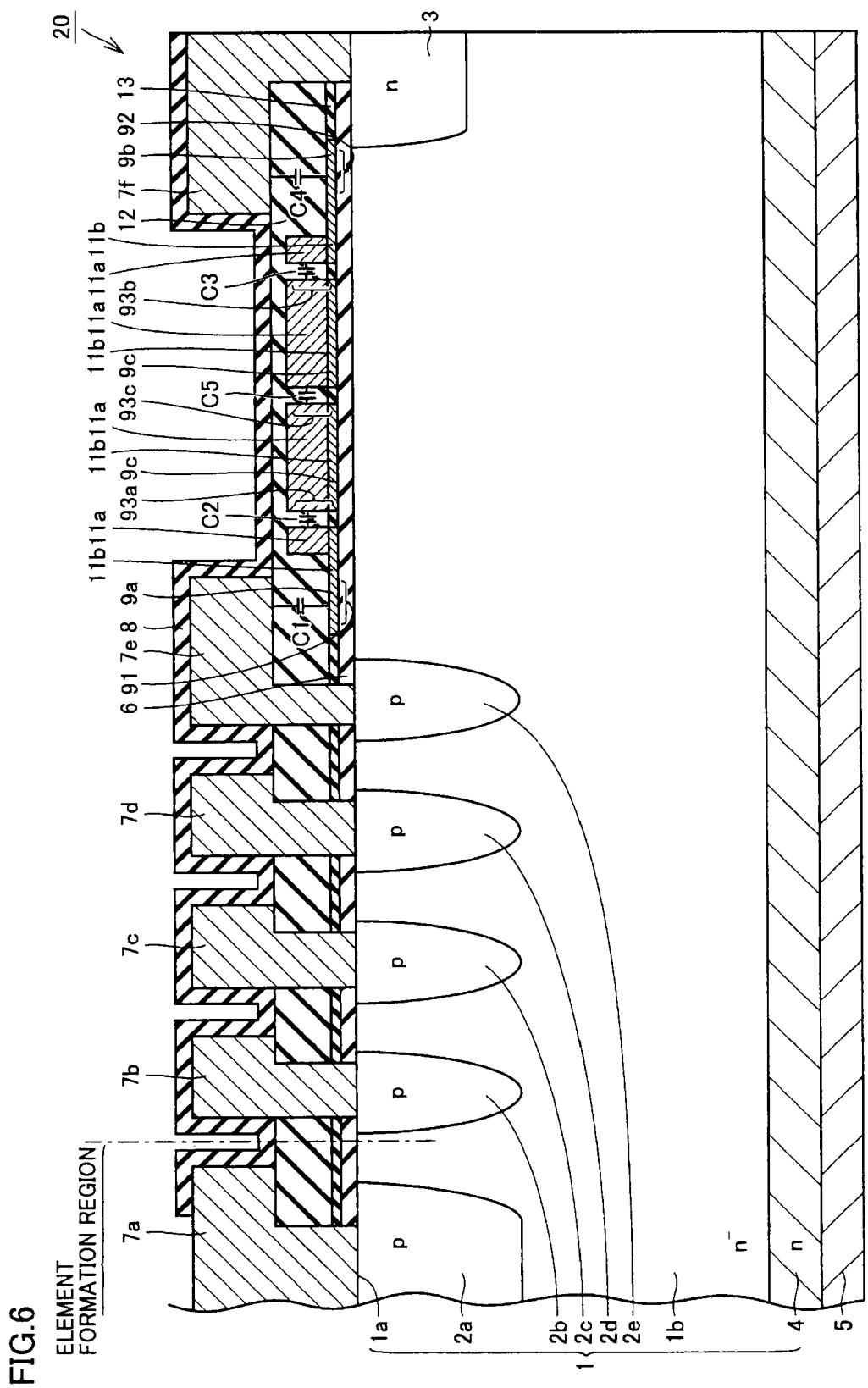
FIG. 6 is a schematic cross sectional view of a semiconductor device in a fourth embodiment of the present invention, showing a cross section corresponding to line IV-IV of FIG. 3.

Referring to FIG. 6, field plates 9a (first portion), 9b (second portion), 9c (third portion) include embedded upper-layer electrodes 11a and lower-layer electrodes 11b. Embedded upper-layer electrodes 11a are provided in contact with the top of lower-layer electrodes 11b.

Semiconductor substrate 1 has a main surface 1a over which respective lower-layer electrodes 11b of field plates 9a, 9b, 9c are formed with a field oxide film 6 interposed between main surface 1a and lower-layer electrodes 11b. Lower-layer electrodes 11b are provided adjacent to one another with an insulation film 13 interposed therebetween. Embedded upper-layer electrodes 11a are formed in contact with the top of lower-layer electrodes 11b. Embedded upper-layer electrodes 11a are provided adjacent to one another with an interlayer insulation film 12 interposed therebetween.

In the present embodiment, two field plates 9c (third portion) are described but the present invention is not limited to this. A single or a plurality of field plates 9c may be provided. Field plates 9a, 9b, 9c are arranged along a direction in which main surface 1a of semiconductor substrate 1 extends.

In the direction in which main surface 1a extends, field plates 9c (third portion) have a portion 93a overlapping with field plate 9a (first portion). Overlapping portion 93a and field plate 9a constitute a capacitor C2. In the direction in which main surface 1a extends, field plates 9c (third portion) have a portion 93b overlapping with field plate 9b (second portion). Overlapping portion 93b and field plate 9b constitute a capacitor C3. Further, in the direction in which main surface 1a extends, field plates 9c (third portion) have portions 93c overlapping with each other. Overlapping portions 93c thereof constitute a capacitor C5.

Each of embedded upper-layer electrodes 11a of field plates 9a, 9b may be provided on a portion of the top of each of lower-layer electrodes 11b or on the entire portion of the top thereof. If each of embedded upper-layer electrodes 11a is provided on the entire portion of the top of each of lower-layer electrodes 11b, an electrical capacitance of guard ring electrode 7e and field plate 9a as well as an electrical capacitance of channel stopper electrode 7f and field plate 9b can be large. It is not to say that a larger electrical capacitance is better, and the electrical capacitances can be determined in consideration of whole conditions such as distribution of electric field.

Embedded upper-layer electrodes 11a are insulated by field oxide film 6, interlayer insulation film 12, and insulation film 13 but may have a portion connected to the passivation film.

The other configurations of the present embodiment are similar to those of the foregoing first embodiment. Hence, the same elements are given the same reference characters and will not be described repeatedly.

The configuration of semiconductor device 20 can be formed using a process flow for a general semiconductor, and embedded upper-layer electrodes 11a can be formed in contact with the tops of lower-layer electrodes 11b.

As such, the semiconductor device of the present embodiment provides effects and functions similar to those of the first embodiment.

In addition, field plates 9a, 9b, 9c are formed to be contained by field oxide film 6, interlayer insulation film 12, and insulation film 13, whereby voltage fluctuations resulting from aluminum slide can be prevented.

Further, field plates 9a, 9b, 9c are made up of two layers, i.e., embedded upper-layer electrodes 11a and lower-layer electrodes 11b, which facilitates increasing in thickness a portion therein opposite to the direction along main surface 1a of semiconductor substrate 1. This allows for an enlarged area in which field plates 9a, 9b, 9c face one another, thereby achieving stabilization of breakdown voltage.

The embodiments described above can be combined appropriately.

The present invention can be applied beneficially in particular to a semiconductor device having a guard ring.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
    a semiconductor substrate having a main surface having an element formation region at a center of the semiconductor substrate;
    a plurality of guard ring electrodes formed on said main surface of said semiconductor substrate to surround a circumference of said element formation region when said plurality of guard ring electrodes and said element formation region is viewed from a plan view;
    a plurality of guard rings formed in said main surface of said semiconductor substrate and electrically connected, respectively, to said plurality of guard ring electrodes;
    a channel stopper electrode formed on said main surface of said semiconductor substrate to be located outside of said plurality of guard ring electrodes when said channel stopper electrode and said plurality of guard ring electrodes are viewed in the plan view;
    a channel stopper region formed in said main surface of said semiconductor substrate and electrically connected to said channel stopper electrode; and
    a field plate disposed over and insulated from said semiconductor substrate,
    said field plate including a first portion disposed to surround a circumference of an outermost guard ring electrode of the plurality of guard ring electrodes when said first portion and the plurality of guard ring electrodes are viewed from the plan view,
    said field plate including a second portion located between said main surface of said semiconductor substrate and the outermost guard ring electrode, and a third portion located between said main surface of said semiconductor substrate and said channel stopper electrode,
    said second portion having a portion overlapping with the outermost guard ring electrode when viewed in a cross-section view,
    said third portion having a portion overlapping with said channel stopper electrode when viewed in the cross-section view.

2. The semiconductor device according to claim 1, wherein:
    said first portion has a portion overlapping with at least one of said second portion and said third portion when viewed in the cross-section view.

3. The semiconductor device according to claim 2, wherein said first portion of said field plate, the outermost guard ring electrode, and said channel stopper electrode are formed of a same layer.

4. The semiconductor device according to claim 1, wherein:
    said main surface extends in a first direction, and
    said second portion, said third portion, and said first portion are arranged along the first direction.

5. The semiconductor device according to claim 1, wherein said field plate is capacitively coupled to the outermost guard ring electrode and is capacitively coupled to said channel stopper electrode.

6. The semiconductor device according to claim 1, wherein said field plate does not overlap said plurality of guard rings.

7. The semiconductor device according to claim 1, wherein said field plate is disposed between an outermost one of said plurality of guard rings and an outer edge of said semiconductor device.

* * * * *